(12) United States Patent
Popescu (10) Patent No.: US 10,234,531 B2
(45) Date of Patent: Mar. 19, 2019

(54) DYNAMIC FIELD DETECTION IN A MRT

(71) Applicant: Stefan Popescu, Erlangen (DE)

(72) Inventor: Stefan Popescu, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 880 days.

(21) Appl. No.: 14/792,792

(22) Filed: Jul. 7, 2015

(65) Prior Publication Data

US 2016/0011284 A1    Jan. 14, 2016

(30) Foreign Application Priority Data

Jul. 10, 2014  (DE) .................. 10 2014 213 413

(51) Int. Cl.
| | | |
|---|---|---|
| *G01R 33/24* | (2006.01) | |
| *G01R 33/36* | (2006.01) | |
| *G01R 33/565* | (2006.01) | |
| *G01R 33/58* | (2006.01) | |

(52) U.S. Cl.
CPC ... *G01R 33/56563* (2013.01); *G01R 33/5659* (2013.01); *G01R 33/56572* (2013.01); *G01R 33/58* (2013.01)

(58) Field of Classification Search
CPC .............. G01R 33/56563; G01R 33/58; G01R 33/56572; G01R 33/5659
See application file for complete search history.

(56) References Cited

U.S. PATENT DOCUMENTS

| | | | |
|---|---|---|---|
| 6,294,916 B1 | 9/2001 | Burl et al. | |
| 6,483,305 B1 | 11/2002 | Miyamoto | |
| 6,489,767 B1 * | 12/2002 | Prado | G01R 33/383 324/309 |
| 2001/0041819 A1 * | 11/2001 | Goto | G01R 33/56518 600/9 |
| 2003/0160616 A1 | 8/2003 | Asano et al. | |
| 2005/0218892 A1 | 10/2005 | Pruessmann et al. | |
| 2008/0116894 A1 * | 5/2008 | Weiger | G01R 33/243 324/320 |
| 2009/0174407 A1 * | 7/2009 | Han | G01R 33/3403 324/318 |
| 2009/0295389 A1 | 12/2009 | Pruessmann et al. | |

(Continued)

FOREIGN PATENT DOCUMENTS

| | | |
|---|---|---|
| CN | 1439336 A | 9/2003 |
| CN | 1900703 B * | 4/2011 |
| EP | 2515132 A1 | 10/2012 |

(Continued)

OTHER PUBLICATIONS

German Office action for related German Application No. 10 2014 213 413.7, dated Apr. 15, 2015, with English Translation.

(Continued)

*Primary Examiner* — Dixomara Vargas
*Assistant Examiner* — Zannatul Ferdous
(74) *Attorney, Agent, or Firm* — Lempia Summerfield Katz LLC (57) ABSTRACT

The embodiments relate to methods and an apparatus for measuring a magnetic field in a magnetic resonance tomography device with at least one field probe, wherein at least one generated delete signal may be applied to reduce a residual magnetization in the at least one field probe.

23 Claims, 9 Drawing Sheets

(56) References Cited

U.S. PATENT DOCUMENTS

2014/0327438 A1   11/2014   Barmet et al.

FOREIGN PATENT DOCUMENTS

| EP | 2010929 | B1 | 11/2013 |
| GB | 2343251 | A | 5/2000 |
| KR | 20010067080 | A | 7/2001 |
| WO | WO2012143574 | A1 | 10/2012 |

OTHER PUBLICATIONS

Skope Magnetic Resonance Technologies LLC Homepage, www.skope.ch, 2013.
Korean Notice of Preliminary Rejection for related Korean Application No. 10-2015-0096336 dated May 16, 2016, with English Translation.
Korean office Action for related Korean Application No. 10-2015-0096336 dated Nov. 1, 2016.
Chinese Office Action for related Chinese Application No. 201510397482.3 dated Oct. 25, 2017, with English Translation.

* cited by examiner

DYNAMIC FIELD DETECTION IN A MRT

CROSS-REFERENCE TO RELATED APPLICATIONS

This application claims the benefit of DE 10 2014 213 413.7, filed on Jul. 10, 2014, which is hereby incorporated by reference in its entirety.

TECHNICAL FIELD

The embodiments relate to methods and apparatuses for measuring a magnetic field in a MRT.

BACKGROUND

Dynamic field cameras for magnetic resonance tomography devices (MRTs) for examining objects or patients using magnetic resonance tomography are known for instance from EP 2010929 B1, EP 2515132 A1, and from a Dynamic Field Camera by Skope Magnetic Resonance Technologies LLC (Zürich, Switzerland) on their Internet homepage.

BRIEF SUMMARY

The scope of the present invention is defined solely by the appended claims and is not affected to any degree by the statements within this summary. The present embodiments may obviate one or more of the drawbacks or limitations in the related art.

An object of the present embodiments is to optimize methods and apparatuses relating to a dynamic field detection in a MRT.

DETAILED DESCRIPTION

Figure 8:
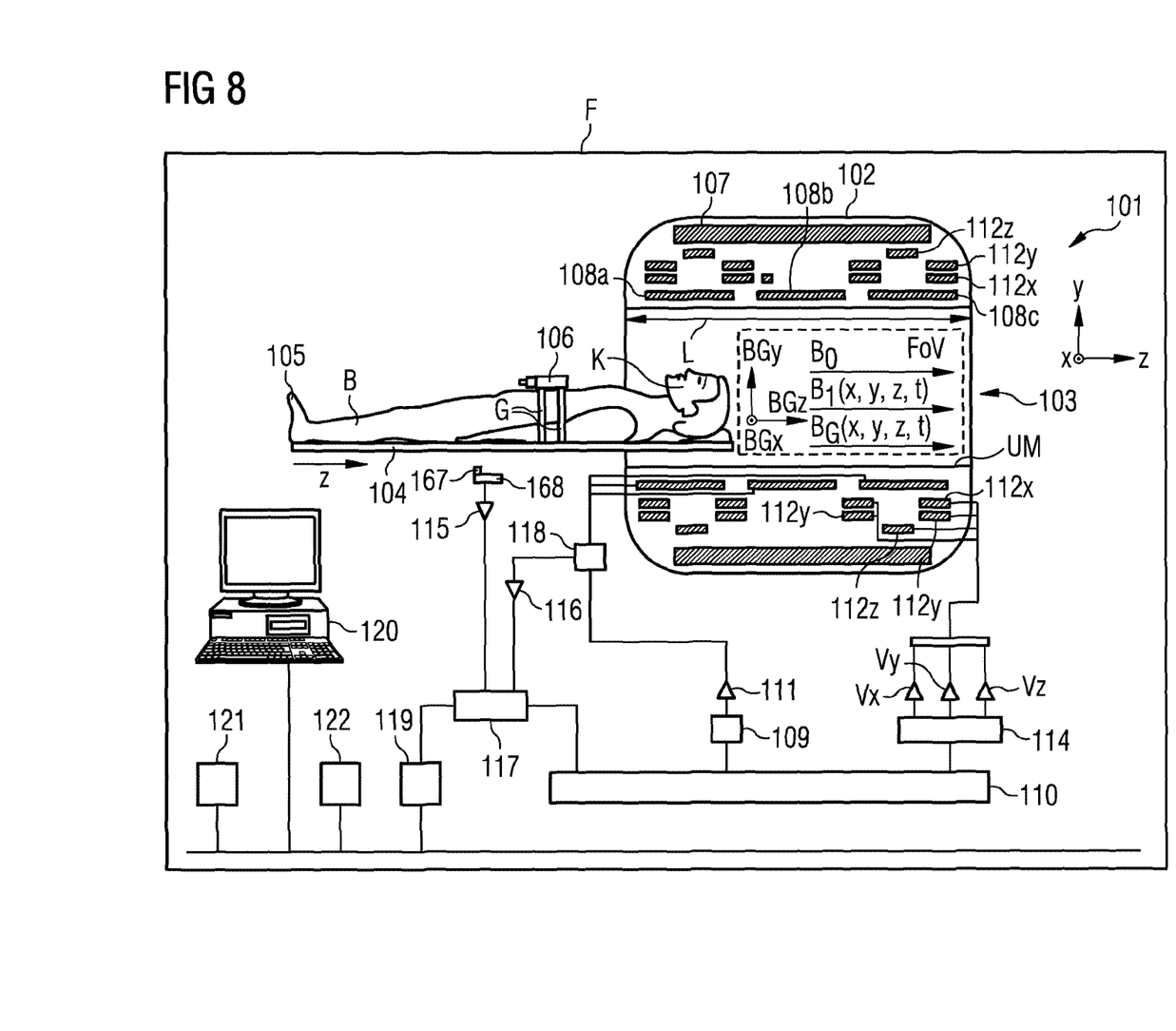
FIG. 8 schematically depicts an example of a MRT system.

FIG. 8 depicts an imaging magnetic resonance device MRT 101 (contained in a shielded room or Faraday cage F) including a hollow cylinder 102 having an in this case tubular bore 103 into which a patient couch 104 bearing a body 105 (e.g., of an examination object or a patient) (with or without local coil arrangement 106) may be introduced in the direction of the arrow z so that images of the patient 105 may be generated by an imaging method. Disposed on the patient here is a local coil arrangement 106, which may be used in a local region (also referred to as field of view or FoV) of the MRT to generate images of a subregion of the body 105 in the FOV. Signals of the local coil arrangement 106 may be evaluated (e.g., converted into images, stored, or displayed) by an evaluation device (168, 115, 117, 119, 120, 121, etc.) of the MRT 101 that may be connected to the local coil arrangement 106, e.g., via coaxial cable or wirelessly 167, etc.

When a magnetic resonance device MRT 101 is used in order to examine a body 105 (e.g., an examination object or a patient) by magnetic resonance imaging, different magnetic fields that are coordinated with one another with the utmost precision in terms of their temporal and spatial characteristics are radiated onto the body 105. A strong magnet (e.g., a cryomagnet 107) in a measurement chamber having an in this case tunnel-shaped bore 103 generates a strong static main magnetic field $B_0$ (e.g., ranging from 0.2 Tesla to 3 Tesla or more). A body 105 that is to be examined, supported on a patient couch 104, is moved into a region of the main magnetic field $B_0$ that is approximately homogeneous in the area of observation FoV. The nuclear spins of atomic nuclei of the body 105 are excited by way of magnetic radio-frequency excitation pulses $B_1$ (x, y, z, t) HF, RF that are emitted via a radio-frequency antenna (and/or a local coil arrangement, if necessary) that is depicted here in simplified form as a body coil 108 (e.g., multipart=108a, 108b, 108c). Radio-frequency excitation pulses (also known as HF or RF) are generated, for example, by a pulse generation unit 109 that is controlled by a pulse sequence control unit 110. Following amplification by a radio-frequency amplifier 111, the pulses are directed to the radio-frequency antenna 108. The radio-frequency system depicted here is indicated only schematically. More than one pulse generation unit 109, more than one radio-frequency amplifier 111, and a plurality of radio-frequency antennas 108 a, b, c may also be used in a magnetic resonance device 101.

The magnetic resonance device 101 also has gradient coils 112x, 112y, 112z by which magnetic gradient fields $B_G$ (x, y, z, t) are radiated in the course of a measurement in order to provoke selective layer excitation and for spatial encoding of the measurement signal. The gradient coils 112x, 112y, 112z are controlled by a gradient coil control unit 114 (and, if appropriate, by way of amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108a, b, c and/or at least one local coil arrangement 106, amplified by assigned radio-frequency preamplifiers 116, and further processed and digitized by a receive unit 117. The recorded measurement data is digitized and stored in the form of complex numeric values in a k-space matrix. A multidimensional Fourier transform may be used to reconstruct an associated MR image from the value-populated k-space matrix.

For a coil that may be operated in both transmit and receive mode, (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

In MR tomography as practiced today, images having a high signal-to-noise ratio (SNR) may be acquired by local coil arrangements (e.g., coils, local coils). These are antenna systems that are mounted in immediate proximity to, e.g., on (anterior), under (posterior), on, or in the body 105.

In the course of a MR measurement, the excited nuclei induce a voltage in the individual antennas of the local coil, which voltage is then amplified by a low-noise preamplifier (e.g., LNA, preamp) and finally forwarded to the receive electronics. So-called high-field systems (e.g., 1.5 T-12 T or more) are used to improve the signal-to-noise ratio, even with high-resolution images. If more individual antennas may be connected to a MR receive system than there are receivers present, a switching matrix (e.g., also partly referred to or realized as RCCS) for example is incorporated between receive antennas and receivers. Said array routes the currently active receive channels (e.g., those currently lying in the magnet's field of view) to the receivers present. This provides more coil elements to be connected than there are receivers available, since in the case of whole-body coverage it is only necessary to read out those coils that are located in the FoV or, as the case may be, in the homogeneity volume of the magnet.

The term local coil arrangement 106 may refer to, e.g., an antenna system that includes, e.g., of one antenna element or of a plurality of antenna elements (e.g., coil elements) configured as an array coil. These individual antenna elements are embodied for example as loop antennas (e.g., loops), butterfly coils, flex coils, or saddle coils. A local coil arrangement includes, e.g., coil elements, a preamplifier, further electronics (e.g., standing wave traps, etc.), a housing, supports, and/or a cable with plug-type connector by which the local coil arrangement is connected to the MRT system. A receiver 168 mounted on the MRT system side filters and digitizes a signal received, (e.g., wirelessly, etc.), by a local coil 106 and passes the data to a digital signal processing device that in most cases derives an image or a spectrum from the data acquired by a measurement and makes it available to the user, e.g., for subsequent diagnosis by him/her and/or for storage in a memory.

FIGS. 1-8 depict embodiments of apparatuses and methods for dynamic (e.g., magnetic field) field detection in a bore of a MRT 101.

A monitoring of a magnetic field (e.g., $B_0$ or $B_1$ or $B_G$ or its sum) using (e.g., magnetic field) field probes FS may relate to the following objective for instance:

Knowledge of the dynamic field change, e.g., with respect to dynamic field errors on account of fault currents, non-ideal gradient coils, or mechanical vibrations and thermal drift effects may be advantageous for a development of new MR sequences. A dynamic field camera according to FIGS. 1-3 with NMR field probes FS arranged on a measuring head MK cylindrically around a spherical measuring volume and a frontend (e.g., transmit/receive) electronics FE is a measuring instrument, which is a good oscilloscope-type tool for real time monitoring of dynamic magnetic fields, and is commercially available from the company Skope Magnetic Resonance Technologies LLC in Zürich in Switzerland. This dynamic field camera in FIG. 1 includes a camera head MK, which includes a number of NMR (NMR=nuclear magnetic resonance) field probes FS, which may be cylindrically distributed and may include a first (stage AE with) electronics. A NMR spectrometer implements the signal detection, processing and visualization. While a camera head MK may be arranged in the bore 103 of a MRT 101, the spectrometer (FE) connected to coaxial cables KK with (e.g., the first electronic stage of) field probes FS may be arranged outside of a RF chamber of a MRT 101. A field probe FS depicted below in greater detail in sections in FIG. 1 includes, for instance, a MR active substance such as a water-copper sulphate mixture.

Measuring Speed and Measuring Accuracy and Probe Relaxation:

After each RF excitation, a coherence service life (and thus measuring time) of approx. 100 ms may be achieved with good magnetic susceptibility adjustment by field probes disposed in a homogeneous magnetic field. The field probes are reactivated and cyclically read out for a longer field monitoring process. Nevertheless, the consecutive excitation of field probes with a repetition time (repetition time TR) of below 500 ms may result in systematic errors in the phase development of the field probe signals on account of incomplete magnetic relaxation to stimulated echoes. There is therefore a dead time requirement (e.g., delay) of e.g., approx. 400 ms between consecutive measurements in which data collection is not possible.

Furthermore, if a field probe is used to measure a strong local gradient, its coherence service life (measurement time) is significantly shorter. Field probes exposed to stronger gradients (e.g., -fields) dephase more quickly and their NMR signals decay more quickly than field probes exposed to a weaker local gradient (e.g., field). Nevertheless, a good measurement accuracy requires field probe signals with a sufficiently high amplitude (SNR) and thus the actually available measurement time is even shorter than the shortest coherence service life.

An advantage of embodiments may lie in field probes being operated at higher repetition rates, with a shorter dead time independent of local gradient (e.g., field) strength and also with a higher SNR for an optimized measurement accuracy.

Figures 2A, 2B, 2C:
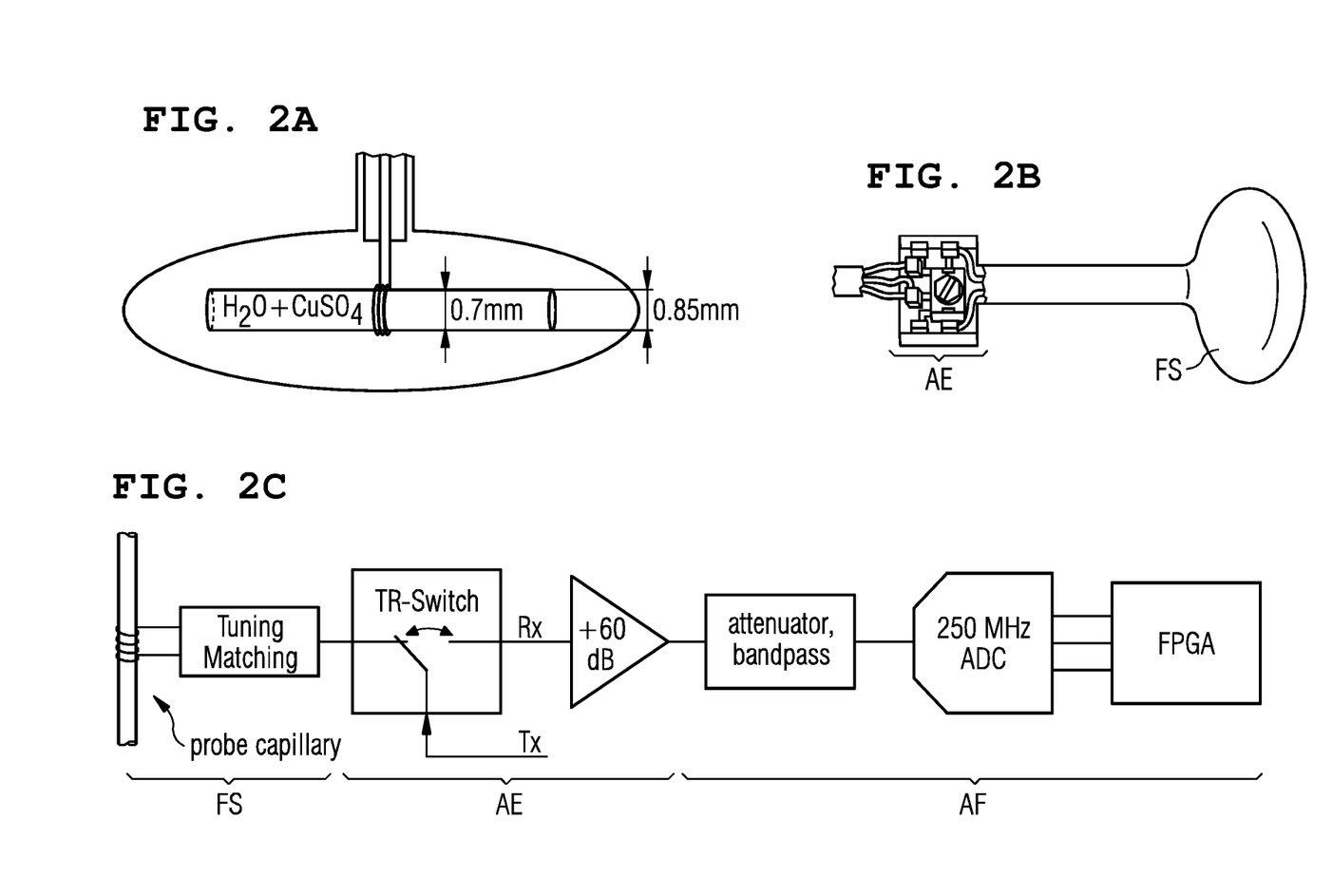
FIGS. 2a, 2b, and 2c depict details of an example of a dynamic field camera.

FIG. 2a depicts a diagram of a field probe FS with an ellipsoid epoxy housing and (as a measurement chamber) with a glass capillary filled with $H_2O$ and $CuSO_4$ and unwound by a copper coil having an inner diameter of 0.7 mm and an outer diameter of 0.85. FIG. 2b depicts an adjustment electronics AE, and a tuning and matching circuit of a field probe FS. FIG. 2c depicts functions divided onto an NMR field probe FS, a frontend RX/TX electronics AE, and a dedicated NMR spectrometer FE.

Figure 3A:
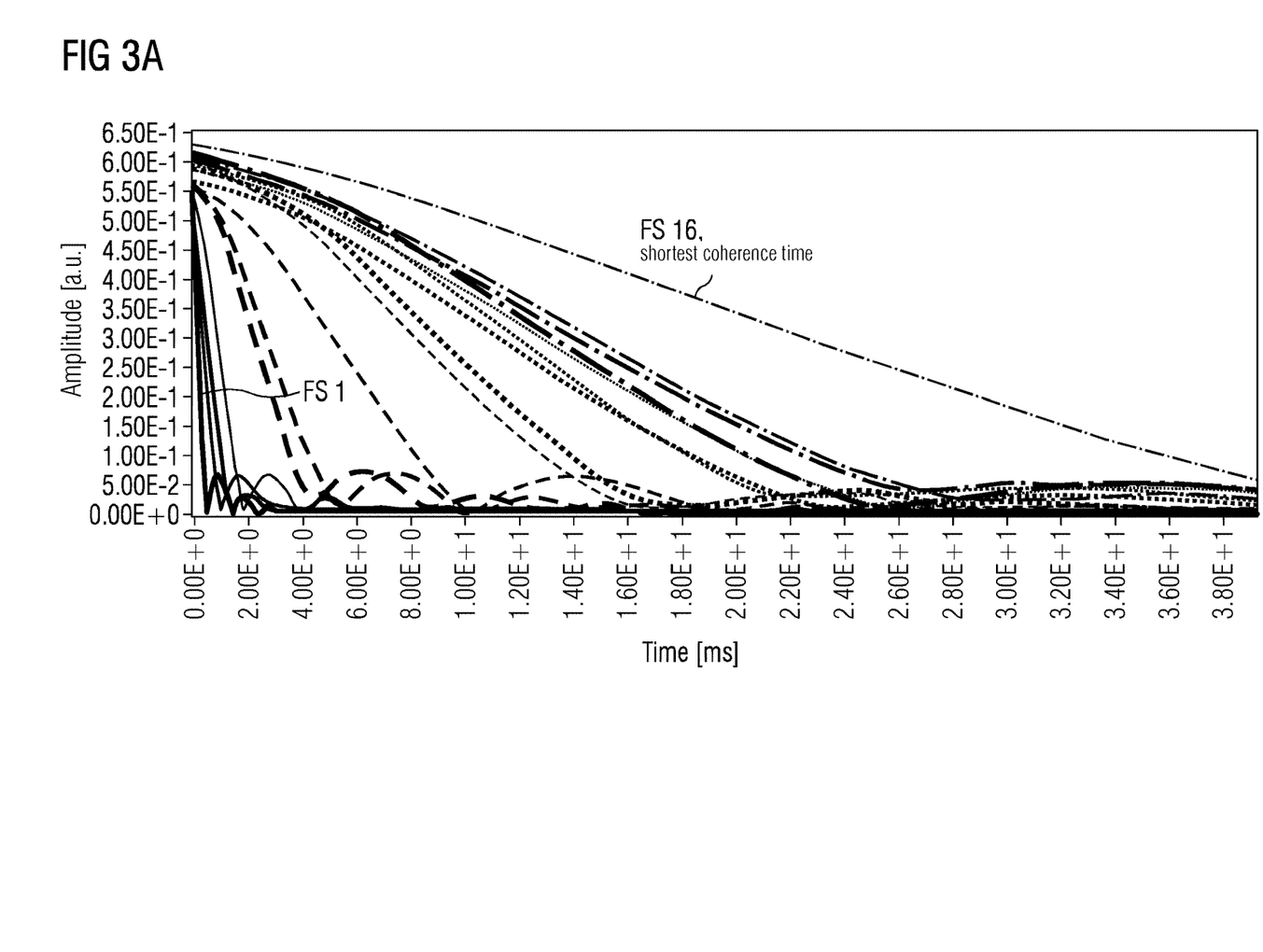
FIGS. 3a and 3b depict examples of different coherence times of different field probe signals.
Figure 3B:
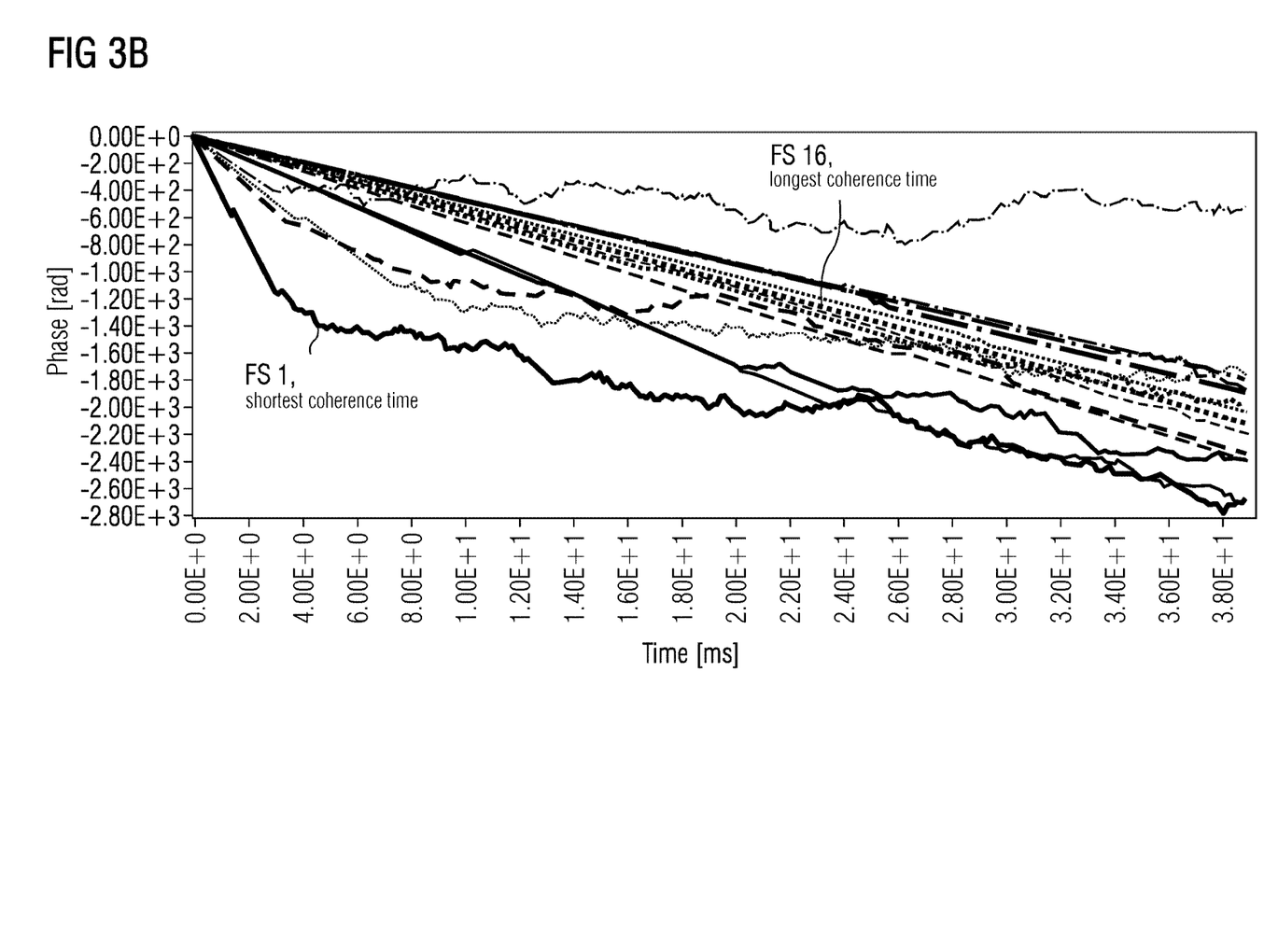

FIG. 3 illustrates different coherence times of different field probe signals of a first field probe FS 1 and a further field probe FS 16. After a first excitation of all field probes at a time t=0, the signals of the field probes decay at a rate or speed that depends on the strength of the local magnetic field gradients (e.g., present in the region of the field probe or its measurement chamber), to which the respective field probe is exposed. In FIG. 3, the field probe 1 is exposed to a stronger gradient field and dephases more quickly and decays more quickly than the field probe 16. After just 0.3 ms, the signal amplitude reaches a zero point and the signal phase has a linear development for approx. 1 ms. The signal of this field probe is subsequently no longer useable. The field probe 16 is by contrast exposed to a weaker local gradient field and the signal phase of this field probe has a linear course with sufficient SNR even after 40 ms. An effective measurement time of just 1 ms is consequently available for all field probes, wherein at least 100 ms elapses until the next excitation (and measurement/readout) or a sufficiently long period of time so that all signals are decayed in order to avoid an accumulation of magnetization across the successive excitations and to avoid a build-up of fixed (steady state) properties.

This may have the following disadvantages. For example, an unforeseeable and moreover different coherence time for all field probes, a dependency of the possible read-out repetition intervals on the (initially possibly not known) measured gradient field strength, not optimally effective small readout cycles (readout duty cycle) due to the need to introduce longer waiting intervals between repeated excitations about the field probes for a sufficient amount of time for a natural decay to zero to result.

New measuring methods/apparatuses may reduce these restrictions and allow for an increased repetition rate of the operation of field probes, with very short dead times independently of local gradient field strengths with a higher SNR for maximized measurement accuracy.

The methods and apparatuses described herein may increase the effective measurement time by accelerating the repetition rate of the reading-out of field probes and avoiding an accumulation of magnetization, namely by a forced active spoiling of residual magnetization (also referred to as remanence magnetization) prior to applying the next excitation of a field probe. Therefore, the configured methods and apparatuses described herein may dephase field probe signals to zero in a very short period of time, instead of waiting for a natural decay of further field probe signals.

An active spoiling of residual magnetization is known per se for MRT sequences. Nevertheless these methods may not be used for a (e.g., magnetic) field camera, because the gradient fields of a MRT may not be activated for an active spoiling of residual magnetization. Therefore different embodiments including suitable hardware circuits are proposed.

One embodiment uses an active spoiling of residual magnetization in field probes by using a forced local gradient field (e.g., in the field probe across a coil L therein). This may take place advantageously, e.g., by using the (RF receive) coil L of a field probe FS that may be used to read out an NMR signal in a field probe. The frontend electronics FE of a field probe may herewith be modified accordingly so that it is in a position to guide a pulse of a current through at least one coil L of the (or a number of or each) field probe FS for a short time interval, in order to generate a strong, very local magnetic field (e.g., magnetic field gradient) in particular within the field probe, for instance, at right angles or opposite to the $B_0$ field, which may actively spoil the residual magnetization (which is subsequently also referred to as spoiling).

In a further embodiment, an active spoiling of residual magnetization is realized by an RF spoiling (e.g., or radio frequency spoiling), in other words by an active spoiling or reducing the build-up of residual magnetization with an RF field or radio frequency field (e.g., with signals of the frequency that the MRT 101 uses to RF excite an examination object).

In a further embodiment, an active spoiling of residual magnetization is realized by combining a cited (e.g., forced in L) local gradient field with a cited RF spoiling.

Figure 4:
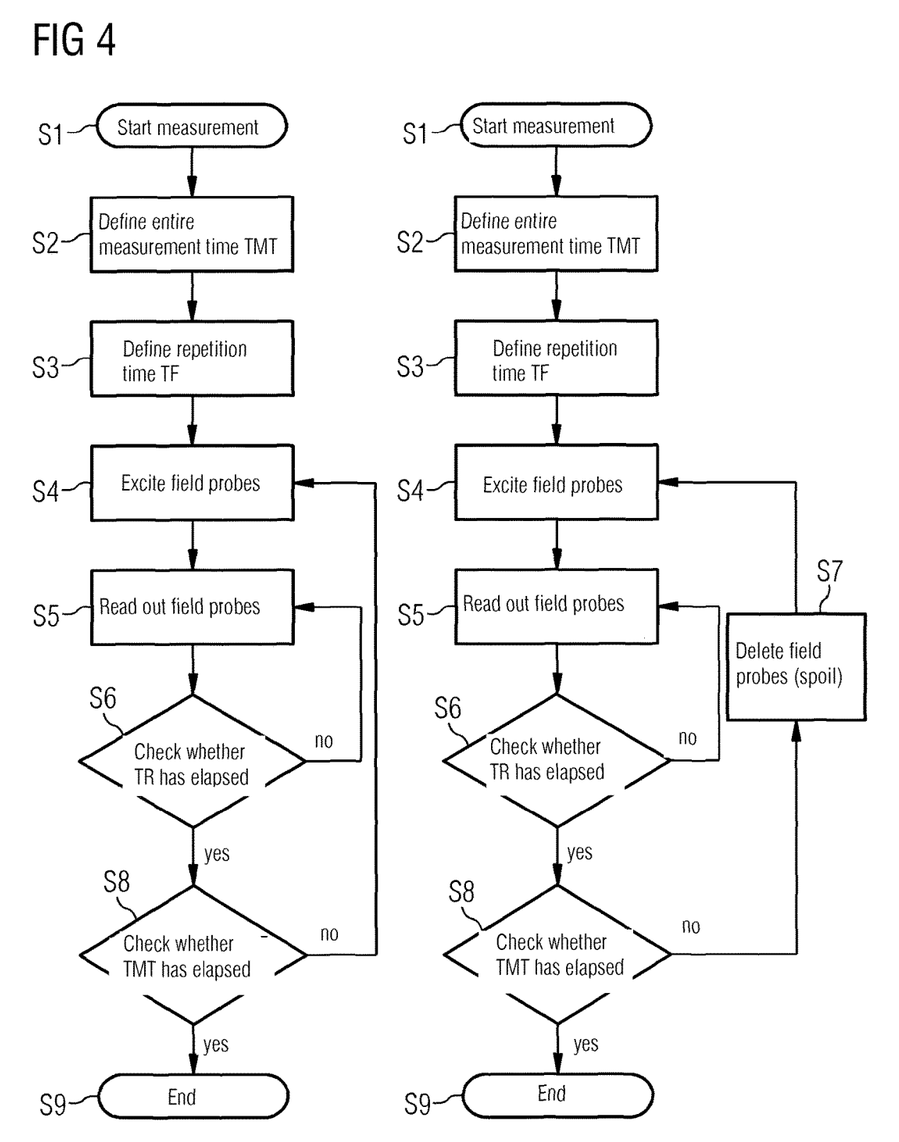
FIG. 4 depicts examples of flow charts for magnetic field measurements using field probes.

FIG. 4 depicts, as a flow chart, differences in an embodiment (e.g., a measurement of a magnetic field with a field probe FS) from measurements of a magnetic field with a more conventional field probe FS:

In FIG. 4 on the left (based on conventional possibilities), in act S1, a measurement of a magnetic field is started. In act S2, the entire measurement time TMT (e.g., how long overall (including repetitions) a magnetic field is to be measured with field probes) is defined for a measurement with field probes. In act S3, the repetition time MR until a/each field probe FS may measure again after a measurement is defined. In act S4, the field probes FS are excited. In act S5, the field probes are read out (read out, in other words the magnetic field measured therewith is determined). In act S6, a check is carried out to determine whether the repetition time (minimum time between two measurements) has elapsed. In act S8, a check is carried out to determine whether the defined overall measurement time TMT has elapsed. If not, it is excited again (act S4) and measured (act S5). If the planned overall measurement TMT has elapsed, the measurement is ended in act S9.

In FIG. 4 on the right, in act S1, a measurement of a magnetic field is started. In act S2, the overall measurement time TMT (e.g., how long (repeatedly) a magnetic field is to be measured with field probes) is defined for a measurement with field probes. In act S3, the repetition time MR until a/each field probe FS may measure again after a measurement is defined. In act S4, the field probes FS are excited. In act S5, the field probes are read out (read out, in other words the data representing the magnetic field measured therewith is read out). In act S6, a check is carried out to determine whether the repetition time (minimum time between two measurements) has elapsed, (and if not measured again). In act S8, a check is carried out to determine whether the defined overall measurement time TMT has elapsed. If field probes are not excited (act S4) and measured (act S5) again after deleting (spoil) the field probes in act S7 with a delete signal). If the planned overall measurement TMT has elapsed, the measurement is ended in act S9.

Figure 5A:
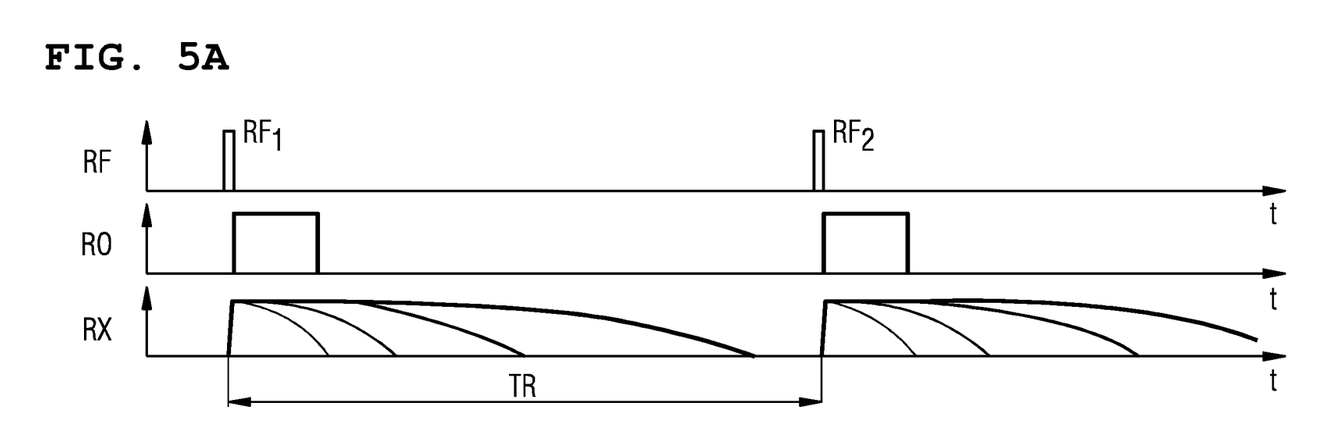
FIGS. 5a and 5b depict examples of flow diagrams for magnetic field measurements using field probes.

FIG. 5 (a) depicts (based on conventional possibilities of known field measurement devices) over the course of time t two field probe excitations RF1, RF2, each after a field probe readout (RO), measurement signals RX relating to a magnetic field one above the other in the direction t of four field probes FS here with a different coherence time, in other words without deleting residual magnetization (e.g., spoiling) by pulses SP that are routed through in each case a coil of a field probe FS.

The field probe with the longest coherence time defines the repetition time TR. The field probe with the lowest coherence time determines the current measurement time RO. The resulting measurement cycle effectiveness (e.g., duty-cycle) RO/TR is lower than in FIG. 5b.

Figure 5B:
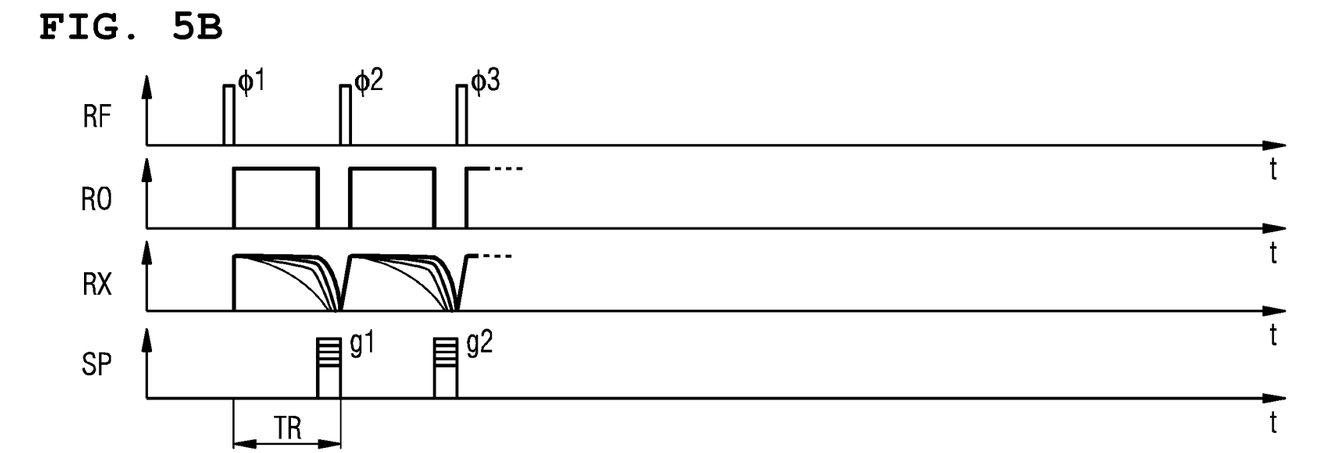

FIG. 5 (b) depicts according to one embodiment over the course of time t field probe excitations RF at three points in time on, e.g., each field probe, in each case subsequently a field probe readout of readable signals RO of the field probes, the presence of measurement signals RX relating to the magnetic field (of four field probes FS with different coherence time), and a deletion of residual magnetization (spoiling) by pulses SP as a delete signal that is routed through in each case a coil L of field probes FS.

Figure 6:
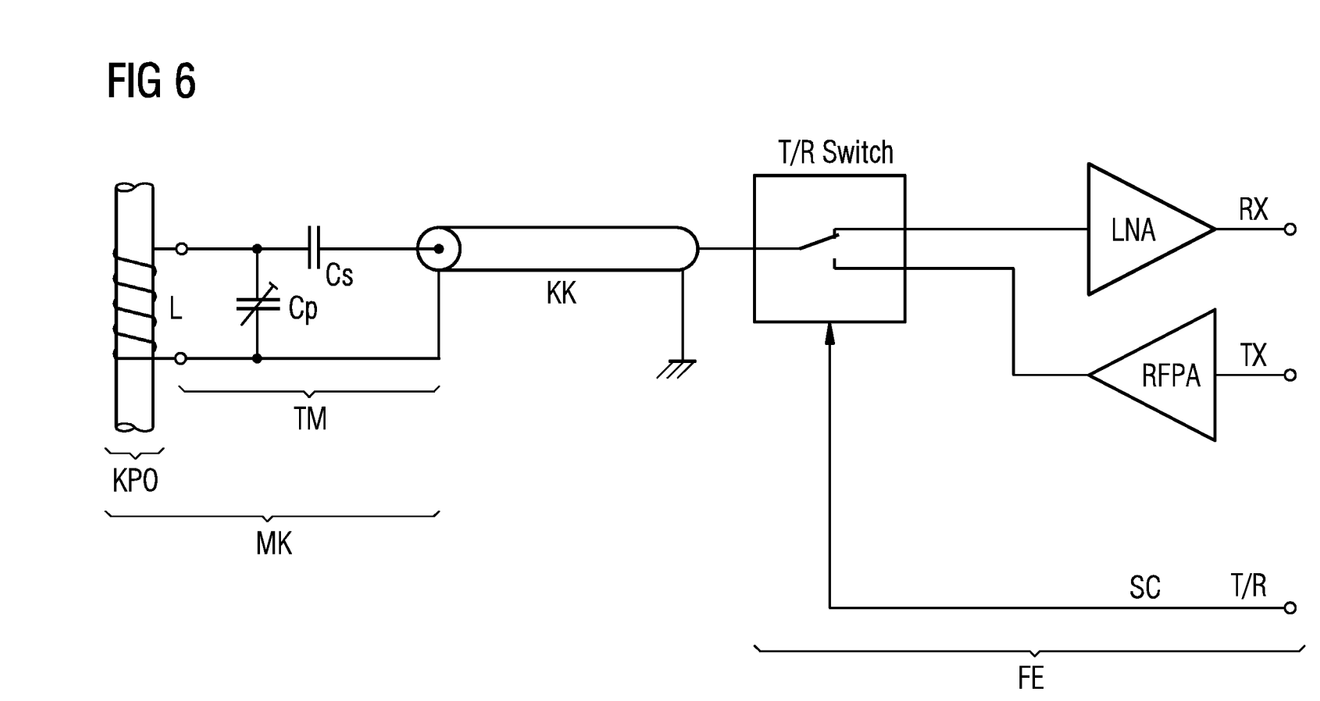
FIG. 6 depicts an example of a simplified block diagram of a measuring head with a field probe and a frontend electronics connected via coaxial cables for magnetic field measurements.

This embodiment monitors the amplitude of all signals in the readout phase. As soon as the signal of the field probe FS with the shortest coherence time decays below a predetermined threshold value, a deletion of residual magnetization (by spoiling, e.g., gradient-spoiling) is activated and a new excitation takes place more quickly than in FIG. 6a following on from a new readout.

According to a further embodiment, a deletion of residual magnetization takes place by a gradient spoiling together with an RF spoiling such that the phase of the RF pulse (Fi, ϕ) as an offset contains a quadratic phase increment for each consecutive excitation.

According to a further embodiment, a deletion of residual magnetization takes place by a gradient spoiling using a delete signal of variable gradient pulse field strength (g1, g2) in consecutive measurements and/or within a spoiling pulse.

FIG. 6 depicts field probes FS and front electronics FE providing just two functions, namely transmitting and receiving. In FIG. 6, LNA is a Low Noise Amplifier, RFPA is an RF Power Amplifier, RX is a signal received by a field probe (e.g., relating to a field strength of a magnetic field), TX is an excitation signal for a field probe, T/R is a transmit or receive mode switch, Cp is a tuning capacity, CS is a matching capacity, KPO is a capillary with e.g. oil therein, TM is a tuning & matching circuit, KK is a coaxial cable, SC is a switch control signal for T/R, MK is a measuring head and FE is a frontend electronics circuit.

FIG. 6 therefore depicts field probes FS and front electronics FE providing two functions. One function is an excitation of a field probe—wherein an excitation signal TX (e.g., RF pulse) for the field probe after amplification in an amplifier (RFPA) is transmitted via the transmit-receive mode switch (T/R/Switch) to the adjusted (tuned) L-Cp circuit (to the tube embodied as a capillary/thin with a coil L and a tuning/adjusting capacitor Cp), in order to polarize the NMR measurement volume (e.g., water with CuSO4) in the tube. A second function is a read out field probe, the resulting MR signal on the field probe readout volume is received by way of the set L-Cp circuit and is forwarded via the transmit-receive mode switch (T/R/Switch) to a LNA and a digital spectrometer or a frontend evaluation electronics FE.

Figure 7:
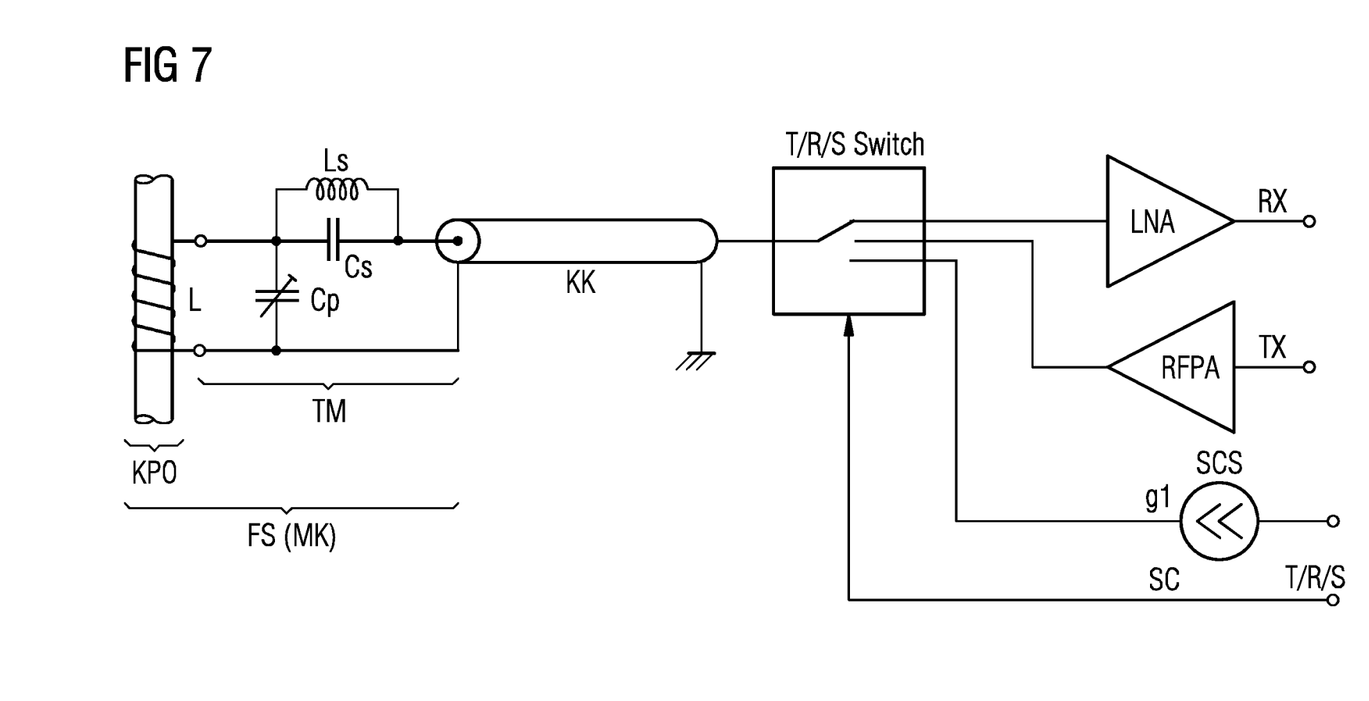
FIG. 7 depicts an example of a simplified block diagram of a measuring head with a field probe by way of example, a frontend electronics connected to a coaxial cable and a residual magnetism reduction for magnetic field measurements.

As well as the elements in FIG. 6, FIG. 7 also depicts a spoiling inductor, a changeover switch T/R/S for switching between: (1) signals (TX) to be transmitted, (2) signals (RX) to be received, and (3) delete signals g1 generated by a delete-signal-current generation facility SC or SCS (Spoiling Current Source, in other words, source or current source) on account of a selection signal T or R or S on the changeover switch T/R/S, which switches the field probe FS to an input for an excitation signal or an output for its measurement signal or an input for a delete signal, e.g., connects it therewith. (A changeover switch may like here be an individual switch or several individual switches may be provided here for each signal type and are controlled by a controller).

Figure 1:
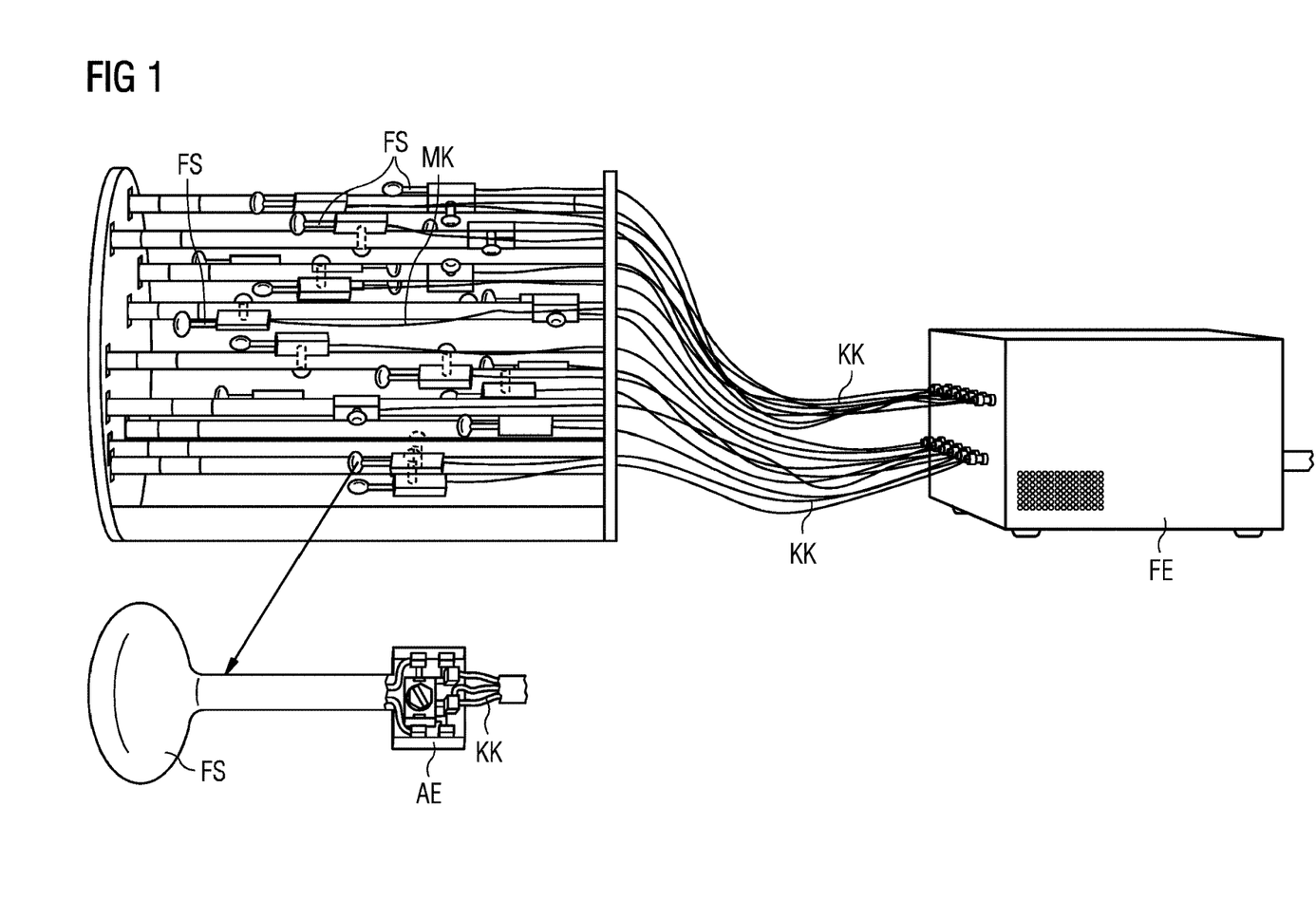
FIG. 1 depicts an example of a dynamic field camera with a camera head, a number of field probes, a first electronics stage and a spectrometer and in greater detail (d) a field probe.

The embodiment depicted in FIG. 7 uses e.g. the same coaxial cable KK as in FIG. 1 between the at least one field probe FS and a frontend electronics FE.

The following three functions are implemented, for instance. (1) An excitation of a field probe is implemented, wherein an excitation signal TX (RF pulse) for the field probe after amplification in an amplifier (RFPA) is transmitted via the transmit-receive mode switch (T/R/Switch) to the adjusted (tuned) L-Cp circuit (to the tube embodied as a capillary/thin with a coil L and a tuning/adjusting capacitor Cp), in order to polarize the NMR measurement volume (e.g., water with CuSo4) in the tube. (2) A read out field probe FS is implemented, wherein the resulting MR signal on the field probe readout volume is received by way of the adjusted L-Cp circuit and is forwarded via the transmit-receive mode switch (T/R/Switch) to a LNA and a digital spectrometer or a frontend evaluation electronics FE. (3) Active spoiling of residual magnetization in the at least one field probe is implemented, wherein a current source SCS with adjustable current strength provides a current via the transmit-receive mode switch (T/R/Switch) and the serial coil Ls (e.g., a RF or HF blocking choke/blocking element) in the coil L that is wound around the capillary tube. This (L) generates a local field (e.g., a gradient field or inverse gradient field) for the active spoiling of residual magnetization in the at least one field probe.

With active spoiling of residual magnetization in the at least one field probe, a (e.g., transverse) residual magnetization may be intentionally reduced or increased prior to the use of a next RF pulse in the next measurement cycle (TR), instead of waiting until the magnetization decays by itself. MRT sequences may in this way be RF-spoiled or gradient-spoiled or a mixture of the two.

With an active spoiling of residual magnetization by RF spoiling, a phase offset may be generated at each consecutive RF excitation pulse (in other words, the same flip angle but in the opposite direction), so that the residual magnetization points in another direction to prevent it from establishing itself in a stable state. A quadratic increase in phases of RF pulses effectively achieves a random RF angle in each measurement cycle TR, so that the residual magnetization has a random phase and does not establish itself in consecutive excitations in order to generate strong, stimulated echoes.

With an active spoiling (e.g., spoiling, gradient spoiling) of residual magnetization by a local (e.g., gradient) field in the field probe or the field probes, a decay of the residual demagnetization is accelerated at the end of each excitation cycle by using a short gradient pulse, which dephases the spin rotation across a field probe (e.g., measurement volume, active substance). The residual (e.g., transverse) magnetization is intentionally destroyed in this way or cancelled prior to the use of a next RF pulse.

With a variable gradient spoiling, variable gradient pulses may be used with strengths that vary from measurement cycle to measurement cycle.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for measuring a magnetic field in a magnetic resonance tomography (MRT) device, the apparatus comprising:
a plurality of field probes in a measuring head, the plurality of field probes configured to provide a plurality of field probe excitation signals,
wherein the apparatus is configured to apply at least one generated delete signal before an excitation signal of at least one field probe of the plurality of field probes has decayed below a predetermined threshold value,
wherein the at least one generated delete signal is configured to reduce a residual magnetization in the at least one field probe of the plurality of field probes and reduce a time interval for repeating an excitation of the plurality of field probes.

2. The apparatus as claimed in claim 1, wherein the delete signal for reducing the residual magnetization in the plurality of field probes is a radio frequency delete signal amplified with an amplifier.

3. The apparatus as claimed in claim 1, wherein the delete signal for reducing the residual magnetization in the plurality of field probes is a radio frequency delete signal amplified with an amplifier, the delete signal being used by the magnetic resonance tomography device also to excite magnetic cores for MRT imaging.

4. The apparatus as claimed in claim 1, wherein the delete signal for reducing the residual magnetization in the plurality of field probes is used by the magnetic resonance tomography device also for gradient pulses in MRT imaging.

5. The apparatus as claimed in claim 1, further comprising:
a controller configured to read out values measured again from the plurality of field probes after one or both of reading out of all field probes of the plurality of field probes or a predetermined repetition time has elapsed, the values relating to the magnetic field.

6. The apparatus as claimed in claim 1, further comprising:
a controller configured to trigger a reduction in the magnetization of the plurality of field probes by switching at least one delete signal to a coil of the plurality of field probes after at least one read-out of all field probes of the plurality of field probes and after a predetermined overall measurement time has elapsed.

7. The apparatus as claimed in claim 6, wherein the delete signal that superimposes a remaining residual magnetization is aligned oppositely with respect to a last excitation by an excitation signal or is aligned randomly in respectively one coil of the plurality of field probes.

8. The apparatus as claimed in claim 1, further comprising:
a controller configured to trigger a reduction in the magnetization of each field probe by switching at least one delete signal to a coil of a respective field probe after at least one reading out of all field probes of the plurality of field probes and after a predetermined overall measurement time has elapsed,
wherein the at least one delete signal has the same or another strength as the delete signal switched after the last read out of all field probes of the plurality of field probes.

9. The apparatus as claimed in claim 1, wherein the apparatus is configured to minimize a residual magnetization by a gradient pulse spoiling by using gradient pulse field strengths that varies within a single spoiling pulse or between spoiling pulses of consecutive measurements.

10. The apparatus as claimed in claim 1, wherein an active spoiling of residual magnetization by a local gradient field in the plurality of field probes takes place at an end of each excitation cycle by using a gradient pulse that dephases a spin rotation across the plurality of field probes with respect to a measurement volume or an active substance.

11. The apparatus as claimed in claim 1, wherein the apparatus is configured to guide the delete signal through at least one coil of the plurality of field probes in order to generate a magnetic field in the plurality of field probes, wherein the magnetic field is aligned opposite to the residual magnetization of the plurality of field probes.

12. The apparatus as claimed in claim 1, further comprising:
an amplifier for amplifying a signal received from the plurality of field probes, wherein the amplifier is configured to be connected to the plurality of field probes.

13. The apparatus as claimed in claim 1, further comprising:
an amplifier for amplifying a signal to be sent to the plurality of field probes, wherein the amplifier is configured to be connected to the plurality of field probes.

14. The apparatus as claimed in claim 1, further comprising:
a current source for generating a delete signal, wherein the current source is configured to be connected to the plurality of field probes.

15. The apparatus as claimed in claim 1, wherein a signal received from the plurality of field probes is configured to be connected to an evaluation facility for determining a magnetic field in the plurality of field probes, in a bore of the MRT device, or in the plurality of field probes and the bore of the MRT device.

16. The apparatus as claimed in claim 15, wherein the signal received from the plurality of field probes is configured to be connected to the evaluation facility in the form of a digital spectrometer.

17. The apparatus as claimed in claim 1, further comprising:
a changeover switch configured to be changed over by a changeover signal for switching (1) at least one measurement signal received from the plurality of field probes to an output, or (2) at the least one generated delete signal for reducing a magnetization in the plurality of field probes to the plurality of field probes.

18. The apparatus as claimed in claim 1, further comprising:
a changeover switch configured to be changed over by a switchover signal for switching (1) at least one excitation signal for a field probe to the plurality of field probes, (2) at least one measurement signal received from the plurality of field probes to an output, or (3) at the least one generated delete signal for reducing a magnetization in the plurality of field probes to the plurality of field probes.

19. The apparatus as claimed in claim 1, wherein the plurality of field probes comprises a tube surrounded by a coil with a measuring volume therein for measuring a magnetic field, the measuring volume comprising water with $CuSO_4$.

20. The apparatus as claimed in claim 1, wherein the plurality of field probes is arranged inside or outside of a local coil, in the bore of a magnetic resonance tomography device, or inside or outside of the local coil and in the bore of the magnetic resonance tomography device.

21. A method for measuring a magnetic field in a magnetic resonance tomography device comprising a plurality of field probes, the method comprising:
conducting an excitation of field probe excitation signals from a plurality of field probes;
measuring a magnetic field in the magnetic resonance tomography device with the plurality of field probes;
applying a generated delete signal before an excitation signal of at least one field probe of the plurality of field probes has decayed below a predetermined threshold value, therein reducing a residual magnetization in the at least one field probe to a coil in the plurality of field probes; and conducting a further excitation of field probe excitation signals and measurement of the magnetic field in the magnetic resonance tomography device with the plurality of field probes.

22. An apparatus for measuring a magnetic field in a magnetic resonance tomography (MRT) device, the apparatus comprising:
a field probe configured to provide a field probe excitation signal,
wherein the apparatus is configured to apply a generated delete signal for reducing a residual magnetization in the at least one field probe via a gradient spoiling, a radio frequency (RF) spoiling, or both gradient and RF spoiling,
wherein, in the gradient spoiling, when present, the apparatus is configured to guide the delete signal through at least one coil of the field probe in order to generate a magnetic field in the field probe and dephase the field probe excitation signal to zero prior to a natural decay of the field probe excitation signal, wherein the magnetic field is aligned opposite to the residual magnetization of the field probe, and
wherein, in the RF spoiling, when present, a phase offset is generated at consecutive RF excitation pulses so that the residual magnetization points in another direction to prevent a stable state.

23. The apparatus as claimed in claim 1, wherein a first field probe of the plurality of field probes has a shortest coherence time, and a second field probe of the plurality of field probes has a longest coherence time,
wherein the longest coherence time defines the time interval for repeating the excitation of the plurality of field probes, and
wherein the apparatus is configured to apply the at least one generated delete signal for reducing the residual magnetization in when an excitation signal of the first field probe with the shortest coherence time decays below the predetermined threshold value, therein reducing the time interval for repeating the excitation of the plurality of field probes.

* * * * *